United States Patent
Huang et al.

(10) Patent No.: US 6,265,313 B1
(45) Date of Patent: Jul. 24, 2001

(54) METHOD OF MANUFACTURING COPPER INTERCONNECT

(75) Inventors: Yimin Huang, Taichung Hsien; Tri-Rung Yew, Hsinchu Hsien; Water Lur, Taipei, all of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/191,632

(22) Filed: Nov. 13, 1998

(51) Int. Cl.⁷ .................................................. H01L 21/44
(52) U.S. Cl. ........................... 438/687; 438/906; 438/677; 438/639
(58) Field of Search .................... 438/687, 638, 438/639, 637, 677, 688, 906, 974, 975

(56) References Cited

U.S. PATENT DOCUMENTS

| | | | |
|---|---|---|---|
| 5,654,232 | * | 8/1997 | Gardner ........................ 438/661 |
| 5,741,626 | * | 4/1998 | Jain et al. ........................ 430/314 |
| 5,985,762 | * | 11/1999 | Geffken et al. ................. 438/687 |

* cited by examiner

Primary Examiner—Caridad Everhart
(74) Attorney, Agent, or Firm—Charles C. H. Wu; Charles C. H. Wu & Associates

(57) ABSTRACT

A method of manufacturing copper interconnects includes the steps of first providing a semiconductor substrate having a dielectric layer thereon. The dielectric layer further includes a copper layer embedded within. An inter-metal dielectric layer is deposited over the dielectric layer. A via opening and a trench opening that exposes a portion of the copper layer are formed in the inter-metal dielectric layer. A thin barrier layer is formed over the exposed copper layer at the bottom of the via opening. The bottom part of the via opening is bombarded by atoms until the copper layer is exposed. Copper material is deposited to fill the via opening and the trench opening, thereby forming a damascene structure.

7 Claims, 4 Drawing Sheets

US 6,265,313 B1

METHOD OF MANUFACTURING COPPER INTERCONNECT

BACKGROUND OF THE INVENTION

1. Field of Invention

The present invention relates to a method of manufacturing a metallic interconnect. More particularly, the present invention relates to a method of manufacturing a copper interconnect.

2. Description of Related Art

As the level of integration of integrated circuits increases, the number of metallic interconnects necessary for connecting all the devices within a silicon chip also increases. Consequently, designs having two or more metallic layers are becoming standard. In the manufacturing of deep submicron integrated circuits, reliable metallic interconnects are difficult to produce due to the high level of integration. Furthermore, interconnects that are formed inside ultra-high level integrated (ULSI) circuits must have sufficiently good electrical connectivity despite having a small junction area. At present, aluminum is frequently used as the base material for fabricating metallic interconnects. However, as the level of integration continues to increase, copper is increasingly being used. Copper has many advantages over aluminum including a lower resistivity, a higher resistance to electromigration, and a higher melting point (copper's melting point is 1060° C. compared with aluminum whose melting point is only 660° C.). In addition, when copper circuits are formed with a silicon chip, operating efficiency can increase up to twice that of the same circuits using aluminum. A copper conductive wire not only can lower RC delay in a circuit, but is also capable of reducing the amount of static electricity stored between conductive wires. Hence, copper is now an important material for forming metallic interconnects.

There are two conventional methods of fabricating metallic interconnects. In the first method, a metallic layer is formed over a substrate, and then a patterned photoresist layer is formed over the metallic layer. Thereafter, using the patterned photoresist layer as a mask, the metallic layer is etched to form metallic lines. Finally, an inter-metal dielectric layer is deposited over the metallic lines. In applying the first method of forming metallic interconnects, the surface of the metallic layer can easily reflect unwanted light back, which leads to errors in the photolithographic operation. Moreover, due to the tougher material properties of metal, etching a metallic layer is much more difficult than etching a dielectric layer.

The second method of fabricating metallic interconnects is commonly known as a damascene process. After a metallic plug is formed in a substrate, a dielectric layer is deposited over the metallic plug and the substrate. The thickness of the dielectric layer should be roughly equal to the intended thickness of the metallic wires. Next, a patterned photoresist layer is formed over the dielectric layer, and then the dielectric layer is etched to form a trench that exposes the metallic plug. Finally, metallic material is deposited into the trench, thereby forming an electrical connection with the plug.

Another method of fabricating metallic interconnects whose processing steps are very similar to that of the damascene process is known as a dual damascene process. The main difference between them is that the damascene process begins after a metallic plug has already been formed in the substrate. In the dual damascene process, first a via opening and a trench pattern are formed in a dielectric layer. Then, metallic material is deposited to fill the via opening and the trench at the same time, thereby forming the interconnects and inter-layer plug connection in a single operation.

FIG. 1 shows a cross-section of a copper interconnect fabricated using a conventional dual damascene process. In FIG. 1, label 100 represents a semiconductor substrate, label 102 represents a dielectric layer, label 104 represents a copper layer, label 106 represents inter-metal dielectric layer, label 108 represents a via opening, label 110 represents a trench opening, and label 112 represents a copper oxide layer. Before carrying out the dual damascene process, some device structures (not shown) such as transistors have already been formed over the semiconductor substrate 100. Then, a dielectric layer 102 is formed above the substrate 100. Embedded within the dielectric layer 102 is a copper layer 104, which acts as a conductive wire. Above the dielectric layer 102, there is an inter-layer dielectric layer 106 having a via opening 108 and a trench opening 110 that expose the copper layer 104. Because copper can be oxidized easily when exposed to air, a copper oxide layer 112 is also formed over the exposed copper layer 104 after the etching operation. Copper oxide is electrically non-conductive. Therefore, if metallic material is directly deposited over the oxide layer following a normal procedure, the via will have a very high resistance, which is undesirable. Consequently, the copper oxide layer 112 should be removed before a barrier layer (not shown) is coated over the interior of the via opening 108, the trench opening 110 and the copper layer 104. Finally, copper is deposited into the openings 108 and 110 to form a copper interconnect and a via plug (not shown).

FIG. 2 is a diagram showing a conventional method that uses radio frequency (RF) argon (Ar) to remove a copper oxide layer above a copper layer. In FIG. 2, radio frequency argon atoms 114 are used to bombard the bottom part of the via opening, thereby removing copper oxide from the surface. However, while bombarding with atomic argon, some copper atoms 104' are struck out from the copper layer 104 and penetrate the sidewalls of the via opening 108. Finally, the straying copper atoms 104' are trapped inside the inter-metal dielectric layer 106.

Since the inter-metal dielectric layer 106 is not covered by a barrier layer, the copper atoms 104' will diffuse into the interior of the inter-metal dielectric layer 106 after performance of some related thermal operations. Copper has a high diffusion rate inside the inter-metal dielectric layer 106, and hence can easily move into the device area of a substrate. Therefore, the devices may be contaminated and quality of the resulting device is inferior. Furthermore, the diffusion of copper also leads to unwanted electrical connection between two isolated conductive structures. Thus, efficiency of the devices is lowered and reliability of the metallic interconnects may become a problem.

In addition, before the deposition of metal into the via opening and trench opening, a barrier layer that can prevent atoms diffusing from a conductive layer into the inter-metal dielectric layer is normally formed first. Hence, a barrier layer is inserted between the copper layer and the subsequently deposited metallic layer. However, with the presence of a barrier layer, resistivity of the via plug inside the via opening increases.

In light of the foregoing, there is a need to provide a better method of fabricating copper interconnects.

SUMMARY OF THE INVENTION

Accordingly, the present invention provides a method of manufacturing copper interconnects that can prevent the sputtered copper atoms from diffusing into the interior of the inter-layer dielectric layer while performing a bombardment for removing copper oxide. Therefore, device damages caused by improper copper diffusion are reduced, and hence quality of the device can be improved.

In another aspect, the invention provides a method of manufacturing copper interconnects that removes a copper oxide layer and a barrier layer above a copper layer before conductive material is deposited into the via opening. Hence, resistivity of the ultimately formed via plug inside the via opening is further reduced.

To achieve these and other advantages and in accordance with the purpose of the invention, as embodied and broadly described herein, the invention provides a method of manufacturing copper interconnects. The method includes the steps of first providing a semiconductor substrate having a dielectric layer thereon. The dielectric layer further includes a copper layer. An inter-metal dielectric layer is deposited over the dielectric layer. A via opening and a trench opening that expose a portion of the copper layer are formed in the inter-metal dielectric layer. A thin barrier layer is formed over the exposed copper layer at the bottom of the via opening. The bottom part of the via opening is bombarded by atoms until the copper layer is exposed. Copper material is deposited to fill the via opening and the trench opening, thereby forming a damascene structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
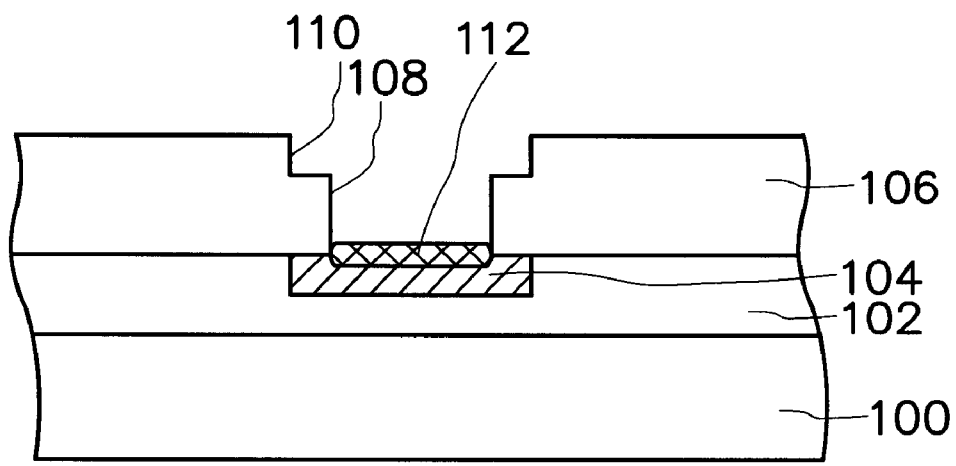
FIG. 1 shows a schematic, cross-sectional view of a copper interconnect fabricated using a conventional dual damascene process.
Figure 2:
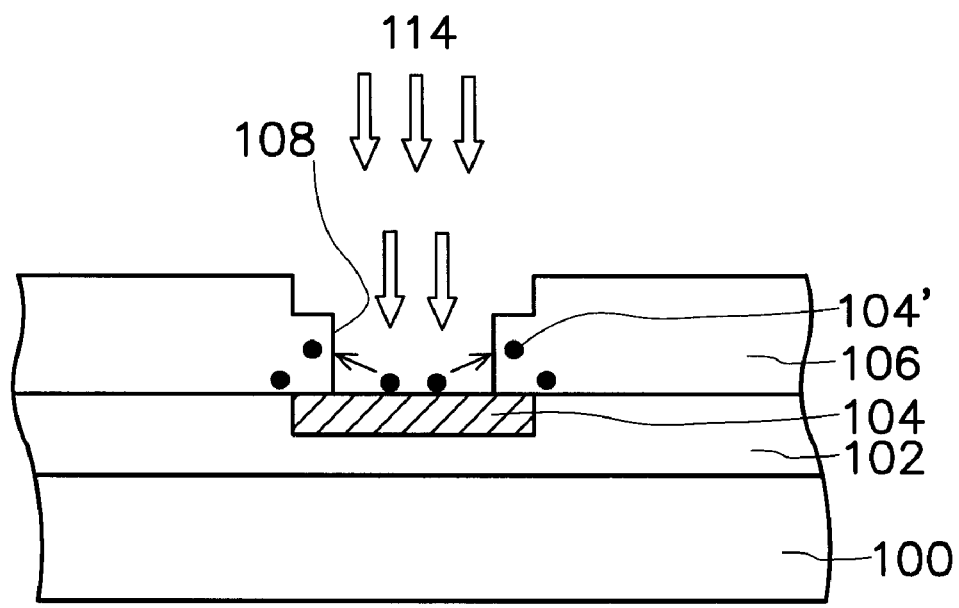
FIG. 2 is a diagram showing a conventional method that uses radio frequency (RF) argon (Ar) to remove a copper oxide layer above a copper layer.

Reference will now be made in detail to the present preferred embodiments of the invention, examples of which are illustrated in the accompanying drawings. Wherever possible, the same reference numbers are used in the drawings and the description to refer to the same or like parts.

FIGS. 3A through 3G are cross-sectional views showing the progression of manufacturing steps in fabricating copper interconnects according to one preferred embodiment of this invention.

Figure 3A:
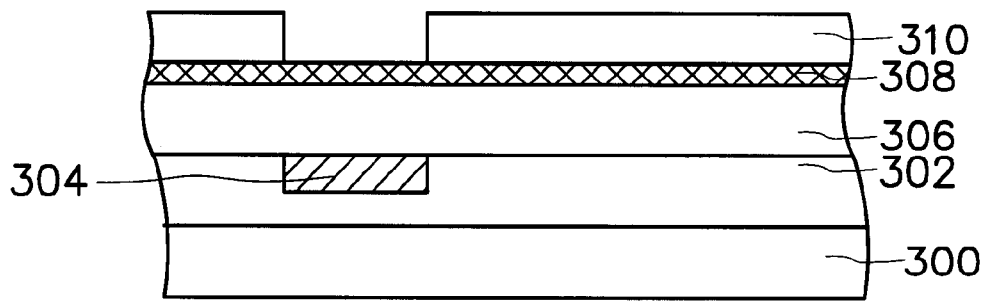
FIGS. 3A through 3G are schematic, cross-sectional view showing the progression of manufacturing steps in fabricating copper interconnects according to one preferred embodiment of this invention.

As shown in FIG. 3A, a substrate 300 having some devices already formed therein is provided. Devices within the substrate 300 are not sketched out, and they may include MOS transistors. The substrate 300 is covered by a dielectric layer 302. Furthermore, a copper layer 304 that connects with one of the devices (not labeled) on the substrate 300 is also formed within the dielectric layer 302. An inter-metal dielectric layer 306 and a mask layer 308 are sequentially formed over the dielectric layer 302. The inter-metal dielectric layer 306 can be a silicon dioxide layer, whereas the mask layer 308 can be a silicon nitride layer. A patterned photoresist layer 310 for forming a via opening is formed over the mask layer 308.

Figure 3B:
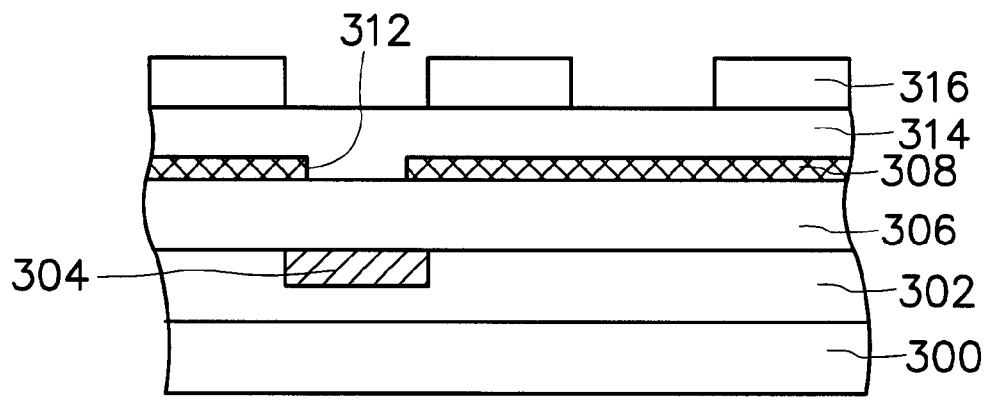

As shown in FIG. 3B, using the patterned photoresist layer 310 as a mask, a portion of the mask layer 308 is removed, thus transferring a via opening pattern 312 to the mask layer 308. The via opening pattern 312 should correspond in position to the location of the copper layer 304 below. Theat is, the via opening 312 is aligned over the copper layer 304. The photoresist layer 310 is removed, and another inter-metal dielectric layer 314 is formed over the mask layer 308. Another photoresist layer 316 for patterning trenches is formed over the inter-metal dielectric layer 314.

Figure 3C:
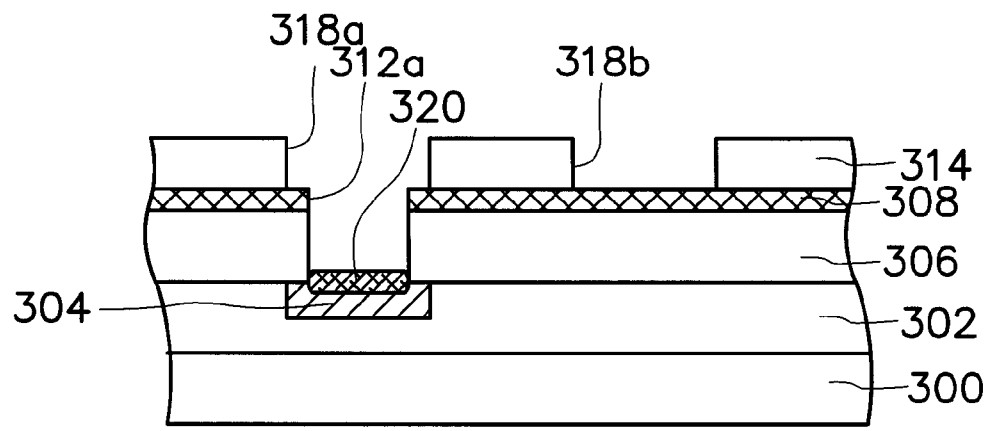

As shown in FIG. 3C, using the mask layer 308 as an etching barrier layer and the photoresist layer 316 as a mask, trenches 318a and 318b are formed within the inter-metal dielectric layer 314. Portions of the dielectric layer 314 are removed to form trenches 318a and 318b. Since the trench 318a further exposes the via opening pattern 312, a portion of the inter-metal dielectric layer 306 is removed to form a via opening 312a. The via opening 312a exposes a portion of the copper layer 304. Because a portion of the copper layer 304 is exposed after the via opening 312a is formed, a portion of the copper layer 304 is oxidized to form a copper oxide layer 320.

Figure 3D:
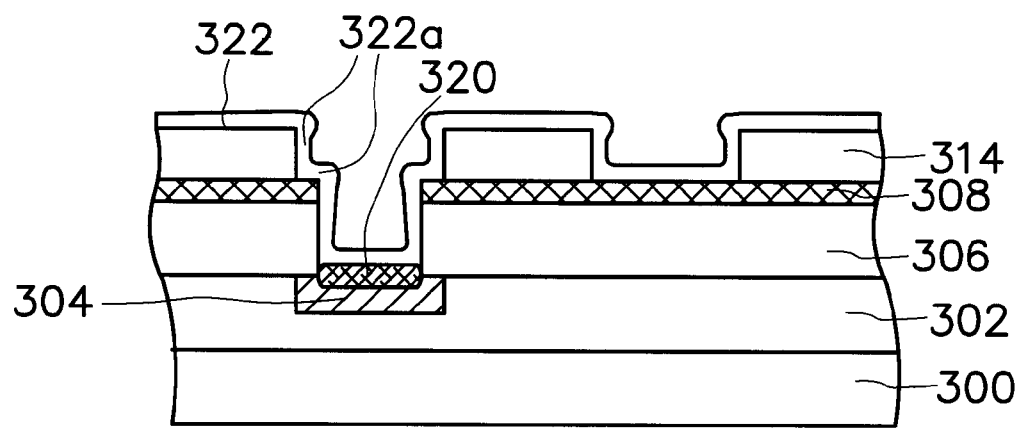

As shown in FIG. 3D, a barrier layer 322 is formed to cover the substrate, including the interior surfaces of the trench openings 318a/318b, the via opening 312a and the copper oxide layer 320. The barrier layer 322 can be a tantalum layer, a tantalum nitride layer, titanium nitride layer or other layer capable of preventing the diffusion of copper atoms into the inter-metal dielectric layer. The barrier layer 322 is preferably formed using physical vapor deposition (PVD). PVD has poor step coverage so that the deposited barrier layer 322 is thicker around the corner regions 322a and thinner above the copper oxide layer 320 at the bottom of the via opening 312a.

Figure 3E:
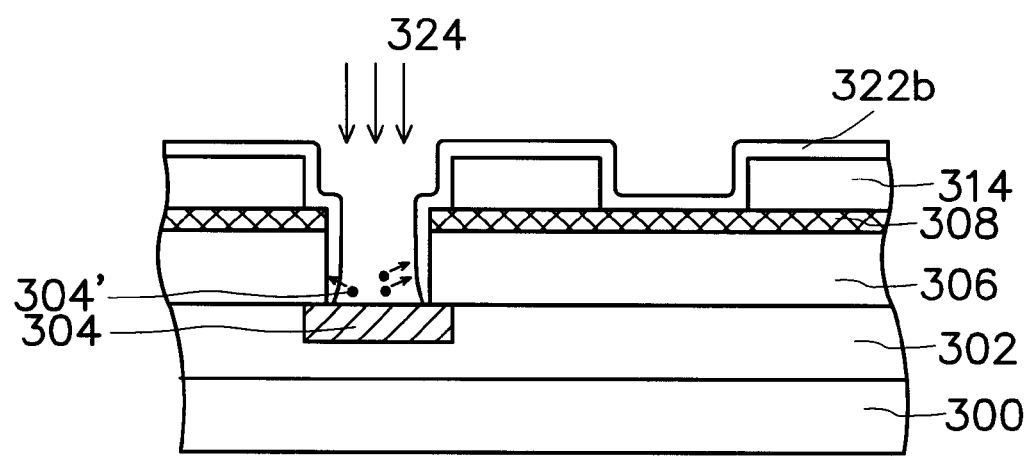

As shown in FIG. 3E, an atom bombardment 324 is carried out, preferably with a voltage bias applied to the substrate 300. Radio frequency argon atoms or argon/hydrogen atoms are used to bombard the substrate 300 in a vertical direction. Portions of the barrier layer 322 that lie perpendicular to the beam of bombarding atoms sputter out and land on the sidewalls of the trench 318 and the via opening 312a. The copper oxide layer 320 at the bottom of the via opening 312a is removed. Furthermore, some of the copper atoms 304' sputter out from the copper layer 304 and adhere to the sidewalls of the via opening 312a. However, due to the presence of a barrier layer 322b over the sidewalls, the copper atoms 304' cannot diffuse into the interior of the inter-metal dielectric layer 306. Moreover, during the bombarding process, the barrier layer 322 at the bottom of the via opening 312a is removed and then deposited back on the sidewalls, thereby thickening the trench 318 sidewalls and the via 312a sidewalls. On the other hand, thicker barrier layer at the corners 322a thins through atomic bombardment. Hence, thickness of the barrier layer 322b is uniform, and step coverage capacity of the barrier layer 322b improves.

Figure 3F:
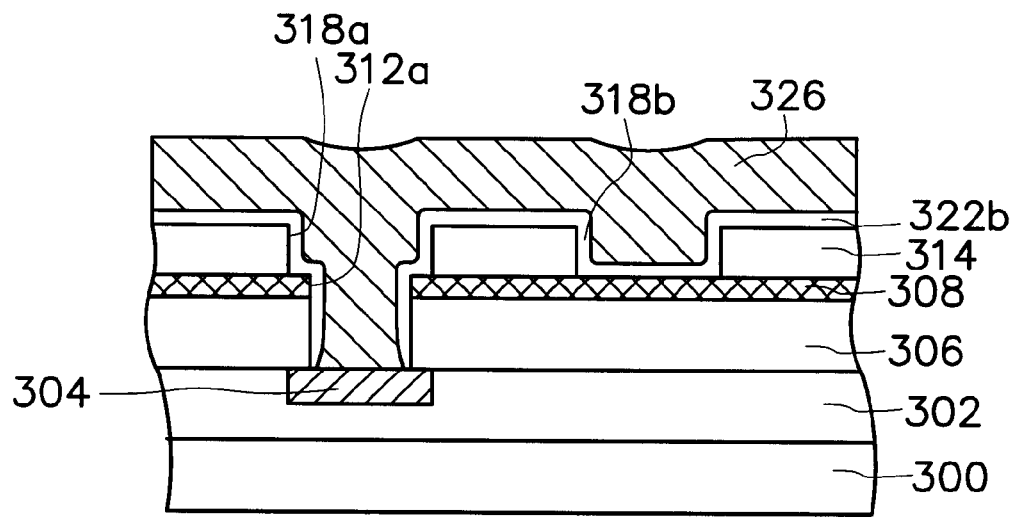

As shown in FIG. 3F, a conductive layer 326 is deposited over the structure shown in FIG. 3E. The conductive layer 326 fills the trench 318 and the via opening 312a, and can be made from copper. The conductive layer 326 is directly connected to the copper layer 304 at the bottom of the via opening 312a. Since there is no barrier layer between the conductive layer 326 and the copper layer 304, resistivity of the via plug is lower than a conventional structure.

Figure 3G:
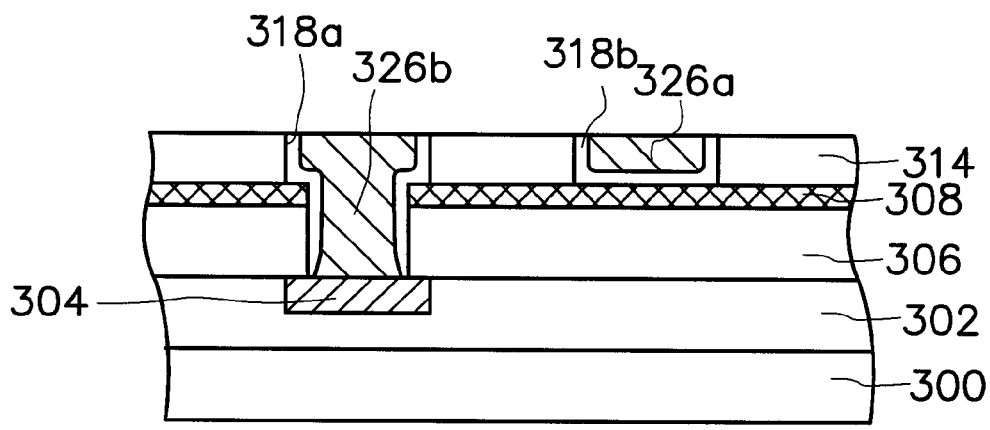

As shown in FIG. 3G, conductive layer 326 outside the trenches 318a and 318b is removed to form simultaneously a conductive layer 326a and another conductive layer 326b. Excess portions of the conductive layer 326 can be removed using chemical-mechanical polishing (CMP).

In summary, the characteristics of this invention include the deposition of a barrier layer using a physical vapor deposition method. Then, radio frequency argon or an argon/hydrogen treatment is performed to remove the barrier layer and copper oxide layer at the bottom of the via opening. The sputtering effect of the argon or argon/hydrogen treatment is able to increase the thickness of the barrier layer coated over the via sidewalls.

Another characteristic of this invention is that the sputtering effect due to an argon or argon/hydrogen treatment is capable of improving the step coverage capacity of the barrier layer formed by physical vapor deposition.

Another characteristic of this invention is that the copper sputtered out from the copper oxide layer by radio frequency argon or argon/hydrogen bombardment is deposited on the barrier layer instead of the inter-metal dielectric layer. Consequently, copper atoms are unable to diffuse into the interior of the inter-metal dielectric layer.

Yet another characteristic of this invention is that the conductive layer is in direct contact with the copper layer at the bottom of the via instead of through an intermediate barrier layer. Therefore, resistivity of the via is lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a copper interconnect, comprising the steps of:

providing a semiconductor substrate having a dielectric layer thereon, wherein the dielectric layer further comprises a copper layer embedded within the dielectric layer;

forming a first inter-metal dielectric layer over the dielectric layer;

forming a patterned mask layer over the first inter-metal dielectric layer;

forming a second inter-metal dielectric layer over the patterned mask layer;

patterning the second inter-metal dielectric layer to form at least a trench;

etching the first inter-metal dielectric layer to form a via opening exposing the copper layer, wherein the exposed copper immediately oxidizes into a copper oxide layer on the copper layer while being exposed;

forming a barrier layer along surfaces of the trench and the via opening;

removing the barrier layer and the copper oxide layer on the copper layer surface by using radio frequency argon/hydrogen; and forming a conductive layer to fill the trench and the via opening.

2. The method of claim 1, wherein the step of forming the mask layer includes depositing silicon nitride.

3. The method of claim 1, wherein the step of forming the barrier layer includes depositing a material selected from at least one of tantalum, tantalum nitride, and titanium nitride.

4. The method of claim 1, wherein the step of forming the barrier layer includes using physical vapor deposition.

5. The method of claim 1, wherein the step of removing the barrier layer and the copper oxide layer above the copper layer includes using radio frequency argon.

6. The method of claim 1, wherein the step of forming the conductive layer includes depositing copper.

7. A method of manufacturing a copper interconnect, comprising the steps of:

providing a dielectric layer having a copper layer thereon;

forming an inter-metal dielectric layer over the dielectric layer;

forming an opening penetrating through the inter-metal dielectric layer to expose the copper layer;

forming a barrier layer along a surface profile of the opening and the inter-metal dielectric layer by physical vapor deposition; and performing an atom bombardment on the barrier layer vertically using radio frequency argon/hydrogen.

* * * * *